(12) United States Patent
Li et al.

(10) Patent No.: US 11,365,832 B2
(45) Date of Patent: Jun. 21, 2022

(54) CONNECTING FASTENER STRUCTURE AND CABLE MANAGEMENT FRAME

(71) Applicant: ZHEJIANG SHIP ELECTRONICS TECHNOLOGY CO., LTD, Ningbo (CN)

(72) Inventors: Yongping Li, Ningbo (CN); Xianwei Luo, Ningbo (CN)

(73) Assignee: ZHEJIANG SHIP ELECTRONICS TECHNOLOGY CO., LTD, Ningbo (CN)

(*) Notice: Subject to any disclaimer, the term of this patent is extended or adjusted under 35 U.S.C. 154(b) by 83 days.

(21) Appl. No.: 15/733,388

(22) PCT Filed: Dec. 25, 2018

(86) PCT No.: PCT/CN2018/123515
§ 371 (c)(1),
(2) Date: Jul. 17, 2020

(87) PCT Pub. No.: WO2019/144749
PCT Pub. Date: Aug. 1, 2019

(65) Prior Publication Data
US 2020/0362993 A1 Nov. 19, 2020

(30) Foreign Application Priority Data

Jan. 23, 2018 (CN) .......................... 201810064962.1
Jan. 23, 2018 (CN) .......................... 201820116319.4

(51) Int. Cl.
*F16L 3/223* (2006.01)
*F16L 3/10* (2006.01)
(Continued)

(52) U.S. Cl.
CPC ............... *F16L 3/2235* (2013.01); *F16L 3/10* (2013.01); *H05K 7/18* (2013.01); *H05K 7/1491* (2013.01)

(58) Field of Classification Search
CPC . F16L 3/2235; F16L 3/10; H05K 7/18; H05K 7/1491
See application file for complete search history.

(56) References Cited

U.S. PATENT DOCUMENTS 6,766,093 B2 * 7/2004 McGrath ................ H04Q 1/066
385/134
8,558,113 B2 * 10/2013 Krietzman ........... H02G 3/0608
174/72 A
(Continued)

FOREIGN PATENT DOCUMENTS

CN    202042846       * 11/2011
CN    202042846 U      11/2011
(Continued)

OTHER PUBLICATIONS

Raising Electronics 1U Horizontal Rack Mount Cable Manager from Amazon.com, first available date: Aug. 19, 2015, weblink: https://www.amazon.com/Horizontal-Mount-Cable-Management-Plastic/dp/B0145HHLLE (Year: 2015).*
(Continued)

*Primary Examiner* — Terrell L McKinnon
*Assistant Examiner* — Ding Y Tan
(74) *Attorney, Agent, or Firm* — Innovation Capital Law Group, LLP; Vic Lin

(57) ABSTRACT

Provided are a connecting fastener structure and a cable management frame. The connecting fastener structure comprises: a main frame body and a cover plate on which a connector is assembled, wherein the cover plate is detachably connected to the main frame body through the connector; connecting through holes are formed in the connector; at least one pair of connecting protrusions matched with the connecting through holes are arranged on the main frame body; a gap exists between the connecting protrusions of the same pair; the connector is inserted into the gap, and in this case, the connecting protrusions are clamped in the connecting through holes; and a whole structure composed of the cover plate and the connector can be directly disassembled from the main frame body, or be connected to the main frame body in an articulated manner, and in this case, the (Continued)

connector is connected to the main frame body in an articulated manner. The connecting fastener structure is convenient to use.

12 Claims, 5 Drawing Sheets

(51) Int. Cl.
*H05K 7/18* (2006.01)
*H05K 7/14* (2006.01)

(56) References Cited

U.S. PATENT DOCUMENTS

| | | | |
|---|---|---|---|
| 9,270,097 B2* | 2/2016 | Krietzman | H05K 7/18 |
| 9,383,536 B2* | 7/2016 | Rutiaga | H02G 3/045 |
| 10,103,528 B2* | 10/2018 | Lewinski | H02G 3/045 |
| 2004/0013390 A1* | 1/2004 | Kim | G02B 6/4453 |
| | | | 385/135 |
| 2015/0146353 A1 | 5/2015 | MacNeil et al. | |

FOREIGN PATENT DOCUMENTS

| | | | |
|---|---|---|---|
| CN | 202435767 U | 9/2012 | |
| CN | 203691823 U | 7/2014 | |
| CN | 204741639 U | 11/2015 | |
| CN | 205081408 U | 3/2016 | |
| CN | 108156785 A | 6/2018 | |
| CN | 207720592 U | 8/2018 | |
| CN | 207720593 U | 8/2018 | |
| HU | 0500592 A2 * | 10/2005 | G02B 6/4452 |

OTHER PUBLICATIONS

NavePoint 2U Metal Rack Mount Horizontal Cable Manager from amazon.com, first available date: Jan. 5, 2016, weblink: https://www.amazon.com/NavePoint-Horizontal-Manager-Raceway-Server/dp/B01A6JP9R8 (Year: 2016).*

International Search Report dated Mar. 27, 2019 from PCT Application No. PCT/CN2018/123515.

* cited by examiner

CONNECTING FASTENER STRUCTURE AND CABLE MANAGEMENT FRAME

BACKGROUND OF THE INVENTION

1. Technical Field

The present invention belongs to the technical field of cable management structures, and relates to a connecting fastener structure and a cable management frame.

2. Description of Related Art

Cable management frames are used to manage electronic cables. Data cables and other cables of data processing devices such as cabinets need to be managed by means of the cable management frames. The cable management frames on the present market are simply composed of a main frame body and a cover plate in general, wherein the cover plate is simply connected to the main frame body, cables are stored in the main frame body, and the cover plate is typically buckled on the main frame body. When the cables need to be maintained and managed, the entire cover plate has to be disassembled from the main frame body and then placed aside, resulting in inconvenience in use. When lots of cables are wound around such cable management frames, it will be difficult to press the cover plate and the main frame body when they are assembled; the cables may move to the joint of the cover plate and the main frame body and may be deformed when squeezed by the cover plate; and the structure required to be assembled and disassembled is inconvenient to use. In view of this, the present invention provides a connecting fastener structure and a cable management frame.

BRIEF SUMMARY OF THE INVENTION

The objective of the present invention is to solve the above problems of the prior art by providing a connecting fastener structure which is designed ingeniously and is convenient to use, and a cable management frame.

The above-mentioned objective of the present invention is fulfilled through the following technical solution: a connecting fastener structure comprises:

A main frame body; and

A cover plate on which a connector is assembled, wherein the cover plate is detachably connected to the main frame body through the connector; connecting through holes are formed in the connector; at least one pair of connecting protrusions matched with the connecting through holes are arranged on the main frame body; a gap exists between the connecting protrusions of the same pair and allows the connector to be inserted therein, and in this case, the connecting protrusions are clamped in the connecting through holes; and a whole structure composed of the cover plate and the connector can be directly disassembled from the main frame body, or be connected to the main frame body in an articulated manner, and in this case, the connector is connected to the main frame body in an articulated manner.

As a further improvement of the present invention, the main frame body is made from metal, and the connector is made from plastics.

As a further improvement of the present invention, two connecting blocks in one-to-one correspondence with the two connecting protrusions of the same pair are oppositely arranged on the connector, a gap exists between the two connecting blocks, and the connecting through holes are respectively formed in each of the two connecting blocks.

As a further improvement of the present invention, each connecting block is provided with a guide slope located on a clamping path of the corresponding connecting protrusion as well as two guide side faces respectively located on two sides of the guide slope.

As a further improvement of the present invention, the two guide side faces connected to the same connection through hole are arranged oppositely, and the two guide side faces defines a guide channel gradually narrowed towards the connecting through hole and connected to the connecting through hole.

As a further improvement of the present invention, an assembly groove has an internal wall formed with a limit groove is formed in the connector, and a limit protrusion tilted outwards and matched with the limit groove is arranged at an assembly position of the connector, on the cover plate.

A cable management frame comprises the connecting fastener structure.

A cable management frame comprises:

A main frame body formed with cable management grooves; and

A cover plate detachably connected to the main frame body through a plurality of pairs of connectors, wherein two connectors of the same pair are vertically assembled on the cover plate; and a whole structure composed of the cover plate and the connectors can be directly disassembled from the main frame body, or one side of the whole structure composed of the cover plate and the connectors is separated from the main frame body, and the other side is articulated with the main frame body, and in this case, the corresponding connectors are connected to the main frame body in an articulated manner.

As a further improvement of the present invention, two pairs of connectors distributed on the left and right are fixedly assembled on the cover plate.

As a further improvement of the present invention, connecting through holes are formed in each connector; a plurality of pairs of connecting protrusions matched with the connecting through holes are arranged on the main frame body; a gap exists between the connecting protrusions of the same pair and allows the corresponding connector to be inserted therein, and in this case, the connecting protrusions are clamped in the corresponding connecting through holes.

As a further improvement of the present invention, two connecting blocks in one-to-one correspondence with the two connecting protrusions of a same pair are oppositely arranged on the connector, a gap exists between the two connecting blocks, and the connecting through holes are respectively formed in each of the two connecting blocks.

As a further improvement of the present invention, an assembly groove has an internal wall formed with a limit groove is formed in each connector, and a limit protrusion tilted outwards and matched with the limit groove is arranged at an assembly position of the connector, on the cover plate.

As a further improvement of the present invention, the cable management grooves are formed in both the upper portion and lower portion of the main frame body; the number of the cable management grooves corresponds to the number of pairs of the connecting protrusions; each cable management groove is connected to the edge of the main frame body via a cable management channel; after the cover plate is connected to the main frame body, an entrance of the cable management channel is closed; and wire hanging structures extending to the center of the cable management groove are arranged at a joint between the cable management groove and the cable management channel.

As a further improvement of the present invention, the cable management channels are narrower than the cable management grooves, and the wire hanging structures are located on corner where internal walls of the corresponding cable management groove and internal walls of the corresponding cable management channel are connected.

As a further improvement of the present invention, an overall width of the cable management grooves is gradually reduced, and wider ends of the cable management grooves are connected to the corresponding cable management channels.

Based on the above technical solution, the present invention at least has the following technical effects:

1. The connecting fastener structure is reasonable in design and suitable for a cable management frame and other appropriate assembly occasions, and can be used to connect two plates and/or frame structures in an articulated manner and achieve convenient assembly and disassembly. If the connectors are vertically assembled on the cover plate, the cover plate may have one side opened and the other side connected in an articulated manner. Particularly, the connecting fastener structure comprises the cover plate, the main frame body and the connectors, wherein the connectors are assembled on the cover plate and are connected to the main frame body through the holes and the protrusions; the gap is located between the protrusions of the same pair, so that a flexible movement space capable of being partially compressed is formed to facilitate entry and exit of the connectors, and the connectors can automatically return after entering and exiting from the flexible movement space. The connecting fastener structure is reasonable in overall design and convenient to use.

2. The wire hanging structures of the cable management frame are designed ingeniously, and the cable management grooves have volumes increased properly and overcome the structural defects of existing cable management grooves that almost all cables are managed and stored in the cable management grooves, and almost no cables are wound in cable management channels, let alone a connection position of a cover plate. Accordingly, the cables are prevented against damage caused by squeeze, and the overall cable management effect is guaranteed.

BRIEF DESCRIPTION OF THE SEVERAL VIEWS OF THE DRAWINGS

The specific implementations of the present invention are further expounded below with reference to the accompanying drawings. Wherein.

Figure 1:
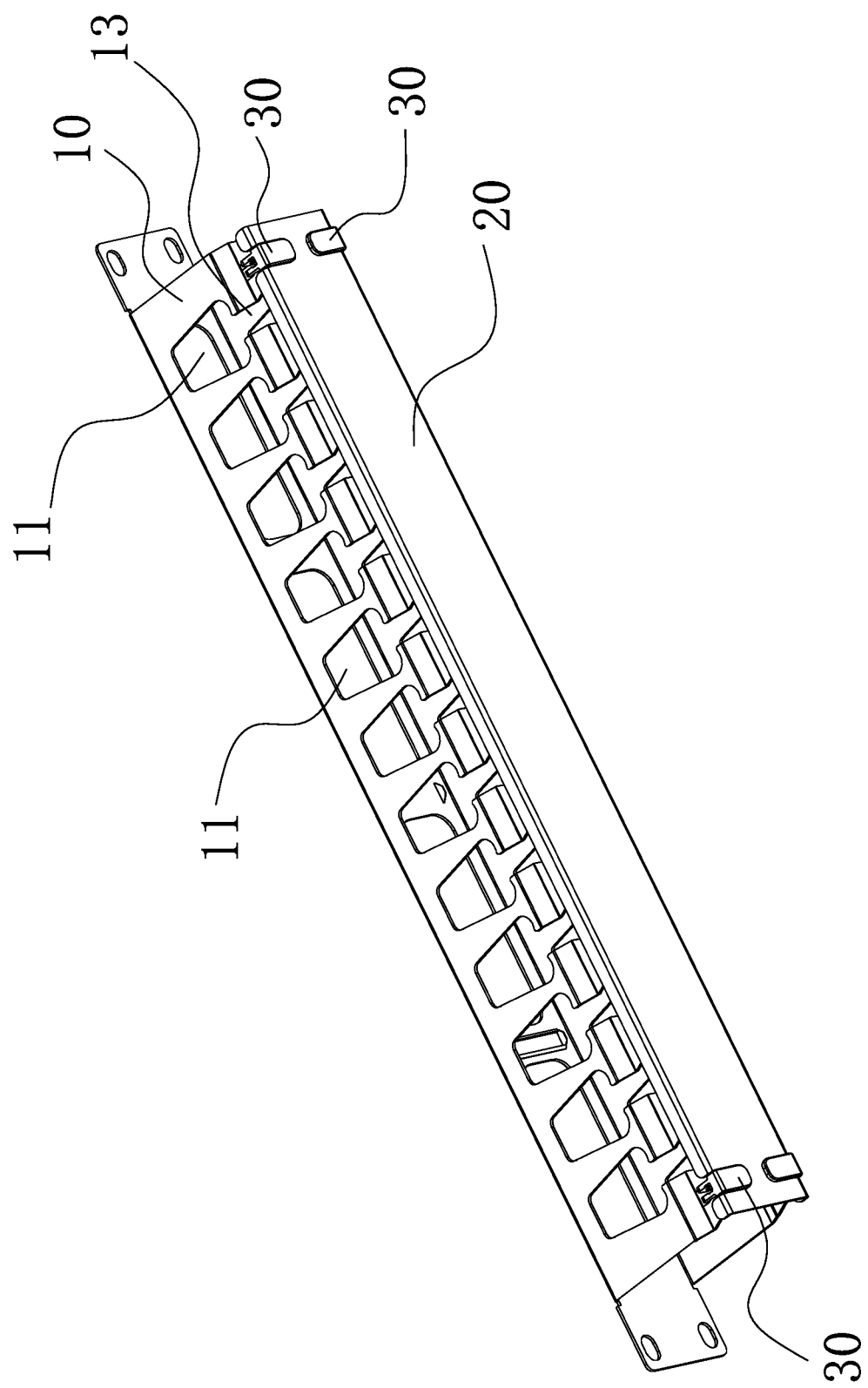
FIG. 1 is a structural diagram of a cable management frame in a preferred embodiment of the present invention.

Reference Signs: 10, main frame body; 11, cable management groove; 12, connecting protrusion; 13, cable management channel; 14, cable hanging structure; 20, cover plate; 21, limit protrusion; 30, connector; 31, connecting block; 311, connecting through hole; 312, guide slope; 313, guide side face; 314, guide channel; 32, assembly groove; 33, limit groove.

DETAILED DESCRIPTION OF THE INVENTION

The technical solution of the present invention is further expounded below with reference to the specific embodiments and accompanying drawings, and the following embodiments are not intended to limit the present invention.

The technical solution of the present invention is expounded below with reference to FIG. 1 to FIG. 5.

As shown in FIG. 1 to FIG. 5, a connecting fastener structure comprises:

A main frame body 10; and

A cover plate 20 on which connectors 30 are assembled, wherein the cover plate 20 is detachably connected to the main frame body 10 through the connectors 30; connecting through holes 311 are formed in each connector 30; at least one pair of connecting protrusions 12 matched with the connecting through holes 311 are arranged on the main frame body 10; a gap exists between the two connecting protrusions 12 of each pair and allows the corresponding connector 30 to be inserted therein, and in this case, the connecting protrusions 12 are clamped in the corresponding connecting through holes 311; and a whole structure composed of the cover plate 20 and the connectors 30 can be directly disassembled from the main frame 10, or be connected to the main frame body 10 in an articulated manner, and in this case, the connectors 30 are connected to the main frame body 10 in an articulated manner.

The present invention protects a connecting fastener structure suitable for a cable management frame and other appropriate assembly occasions, which can be used to connect two plates and/or frame structures in an articulated manner and achieve convenient assembly and disassembly. Particularly, the connecting fastener structure comprises a cover plate 20, a main frame body 10, and connectors 30 (three connecting structures), wherein the connectors 30 are assembled on the cover plate 20 and are connected to the main frame body 10 through holes and protrusions; a gap exists between the protrusions of the same pair, so that a flexible movement space capable of being partially compressed is formed to facilitate entry and exit of the connectors 30, and the connectors can automatically return after entering and exiting from the flexible movement space. The entire connecting fastener structure is reasonable in design and convenient to use.

In the present invention, the connectors 30 and the cover plate 20 which are independent of each other (not integrally formed) are assembled together, and the connectors 30 in close fit with the cover plate 20 are improved to realize movable connection of the cover plate 20 and the main frame body 10; and the cover plate 20 may have one side opened and the other side connected to the main frame body 10 in an articulated manner by properly setting the number and positions of the connectors 30, and in this case, the connector 30 on the corresponding side of the cover plate 20 is connected to the main frame body 10 in an articulated manner. In this way, the problem of placement of the cover plate 20 completely disassembled from the main frame body 10 is solved, and open sides of the cover plate 20 can be easily switched (for example, the cover plate 20 has an upper side opened and a lower side connected to the main frame body 10, or has the lower side opened and the upper side connected to the main frame body 10), so that operation and maintenance are greatly facilitated.

In a preferred or optional embodiment, the main frame body 10 is made from metal, the cover plate 20 is preferably made from metal, and the connectors 30 are made from plastics.

To decrease scratches and prolong the service life of parts, preferably, connecting protrusions 12 are in smooth or circular contact with the corresponding connector 30. In this way, resistance is reduced, and abrasion is avoided.

Such combination of the plastic connectors 30, the metal cover plate 20, and the metal main frame body 10 means a connection between plastic fasteners and a metal frame, so that the flexible movement space at a connection position, as well as the strength of the whole structure, support stability and reliability, and connection stability and reliability is optimally guaranteed.

To further fulfill the flexible movement space formed when each connector 30 is clamped with the main frame body 10, two connecting blocks 31 in one-to-one correspondence with the two connecting protrusions 12 of the same pair are oppositely arranged on the connector 30; a gap exists between the two connecting blocks 31; connecting through holes 311 are respectively formed in the connecting blocks 31; and when the connectors 30 are clamped with the main frame body 10, the connecting blocks 31 are clamped in the gap between the corresponding connecting protrusions 12, and the connecting protrusions 12 are correspondingly clamped, along external walls of the connecting blocks 31, into the connecting through holes 311 in the connecting blocks 31. When disassembly is required, the cover plate 20 together with the connectors 30 is outwards pulled to disengage from the main frame body 10. If one end of the cover plate 20 is opened, the connector 30 at the other end of the cover plate 20 is connected to the main frame body 10 in an articulated manner; and in this case, the cover plate 20 can rotate around an articulated point, that is, the connecting protrusions 12 are connected into the corresponding connecting through holes 311 in an articulated manner.

Of course, the rigid main frame body 10 with gaps also has certain flexible spaces. However, the flexible movement space formed by means of the cooperation between each plastic connector 30 and the rigid main frame body 10 can be partially compressed and then restored, thus achieving a better effect, facilitating the repeated entry and exit of the connectors 30, and guaranteeing the strength of the whole structure formed after the plastic connectors 30 are connected to the rigid main frame body 10.

Preferably, each connecting block 31 is provided with a guide slope 312 located on a clamping path of the corresponding connecting protrusion 12 as well as two guide side faces 313 respectively located on two sides of the guide slope 312.

Further, the two guide side faces 313 connected to the same connecting through hole 311 are arranged oppositely, and the two guide side faces 313 defines a guide channel 314 gradually narrowed towards the connecting through hole 311 and connected to the connecting through hole 311, and the corresponding guide slope 312 is located on the lower portion of the guide channel 314. By means of such guide structure, the connecting block 31 can be connected to the corresponding connecting protrusions 12 more closely and can enter and exit from the gap between the connecting protrusions 12 more smoothly and steadily.

Preferably, to make sure that the connectors 30 are fixedly assembled and limited on the cover plate 20 reliably, an assembly groove 32 has an internal wall formed with a limit groove 33 is formed in each connector 30; a limit protrusion 21 tilted outwards and matched with the limit groove 33 is arranged at the assembly position of the connector 30, on the cover plate 20; and the limit groove 33 is preferably located between the corresponding two connecting blocks 31, so that the use rate of space is further improved, and the limit protrusion 21 clamped in the limit groove 33 is unexposed and is easy to machine.

During assembly, the edge of the cover plate 20 is correspondingly inserted into the assembly grooves 32, and the limit protrusions 21 are clamped in the limit grooves 33, such that the connectors 30 are fixedly and firmly assembled on the cover plate 20. Normally, the connectors 30 will not fall from the cover plate 20.

The present invention protects a cable management frame comprising the connecting fastener structure, that is, the cable management frame comprises a main frame body 10 and a cover plate 20 on which connectors 30 are assembled, wherein the cover plate 20 is detachably connected to the main frame body 10 through the connectors 30; connecting through holes 311 are formed in each connector 30; at least one pair of connecting protrusions 12 matched with the connecting through holes 311 are arranged on the main frame body 10; a gap exists between the connecting protrusions 12 of the same pair; the corresponding connector 30 is inserted into the gap, and in this case, the connecting protrusions 12 are clamped in the corresponding connecting through holes 311; and a whole structure composed of the cover plate 20 and the connectors 30 can be directly disassembled from the main frame 10, or be connected to the main frame body 10 in an articulated manner, and in this case, the connectors 30 are connected to the main frame body 10 in an articulated manner.

Figure 2:
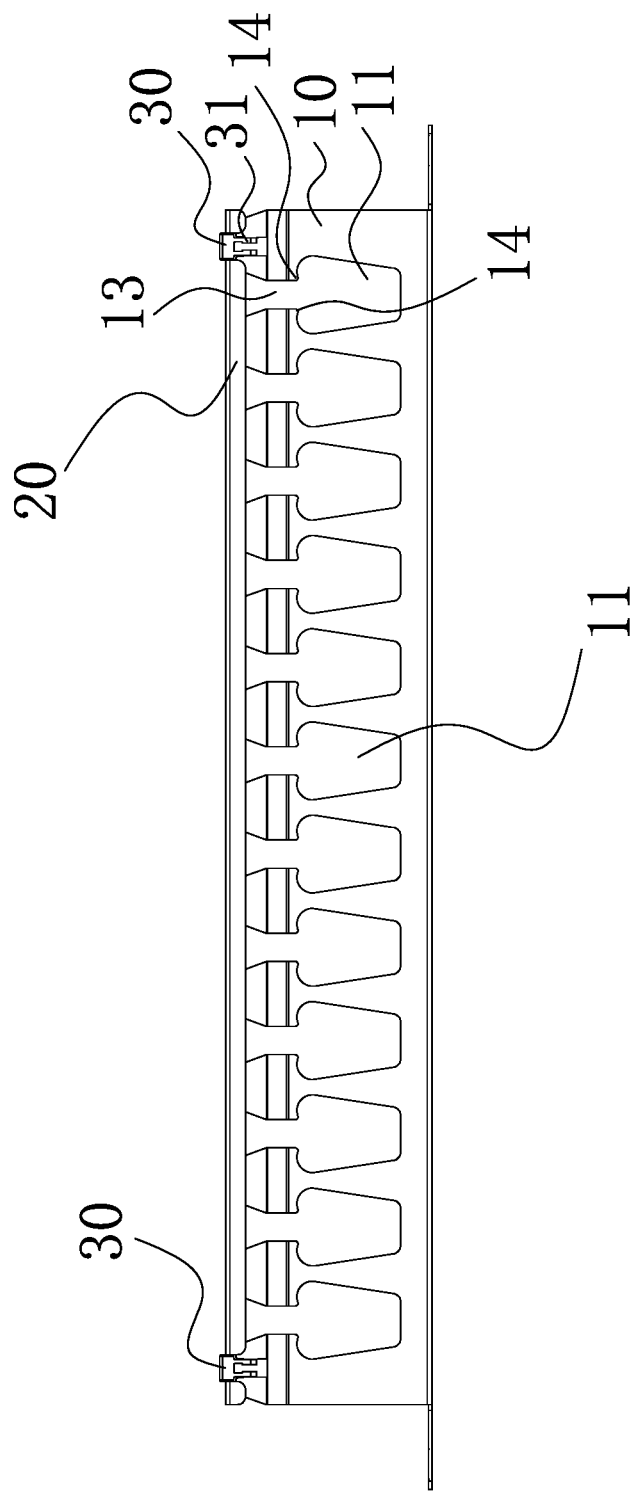
FIG. 2 is a structural diagram of FIG. 1 from another perspective.
Figure 3:
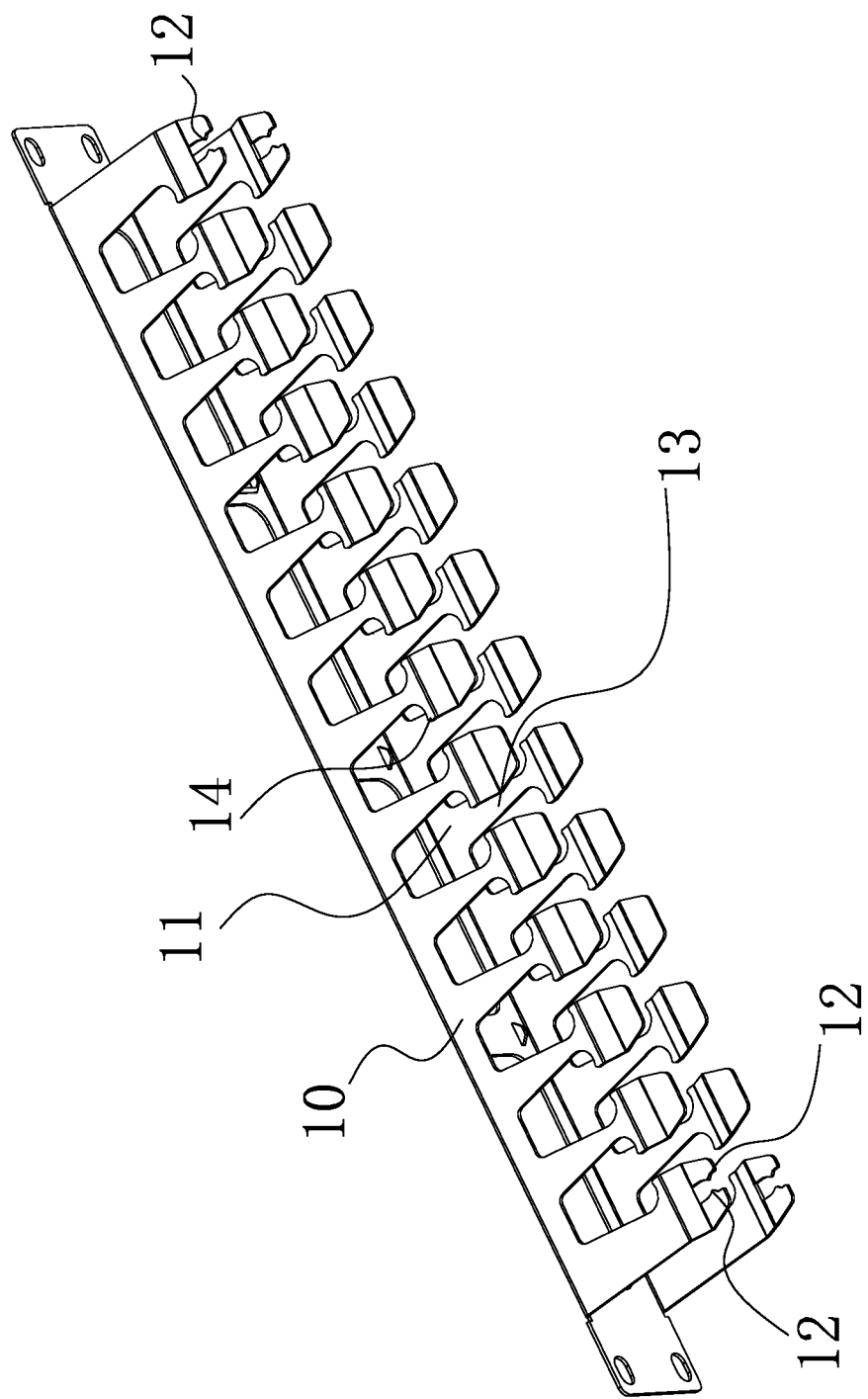
FIG. 3 is a structural diagram of a main frame body in the preferred embodiment of the present invention.
Figure 4:
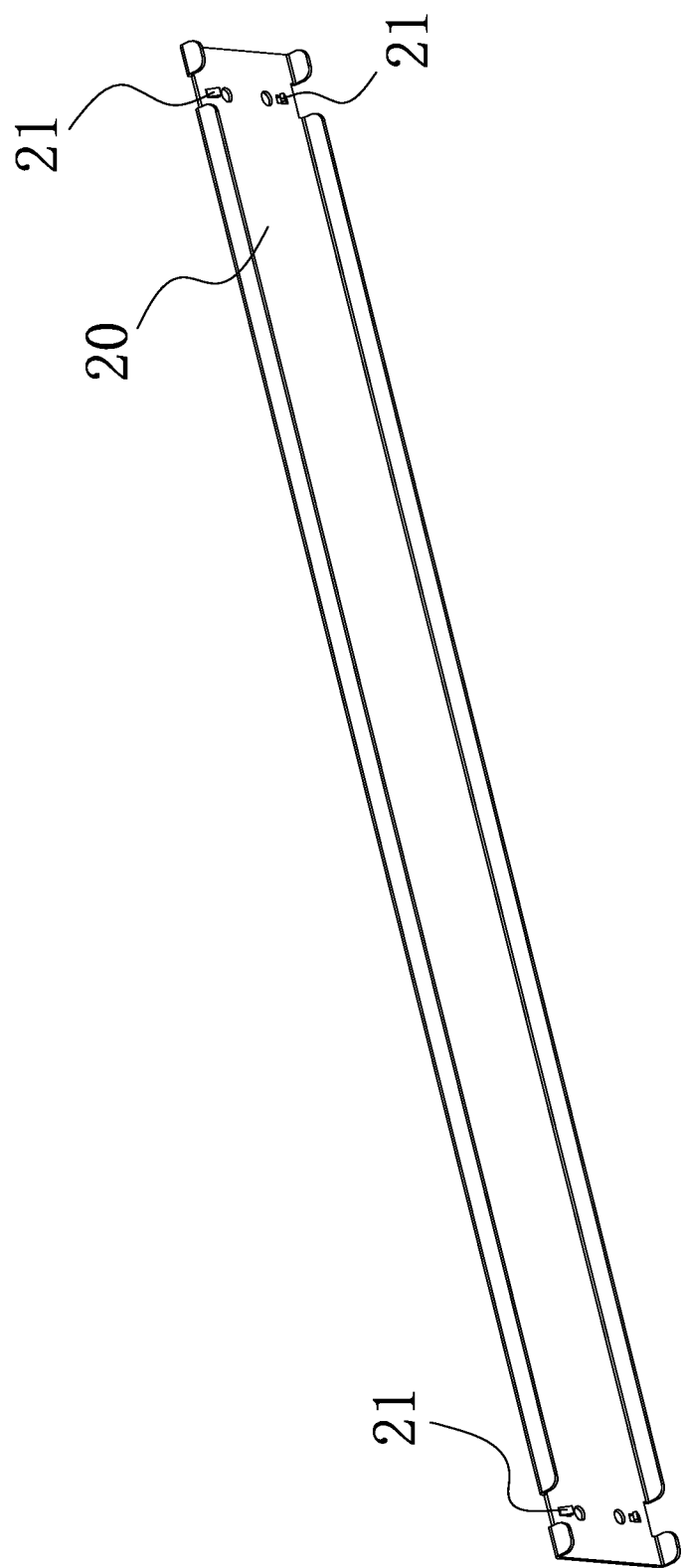
FIG. 4 is a structural diagram of a cover plate in the preferred embodiment of the present invention.
Figure 5:
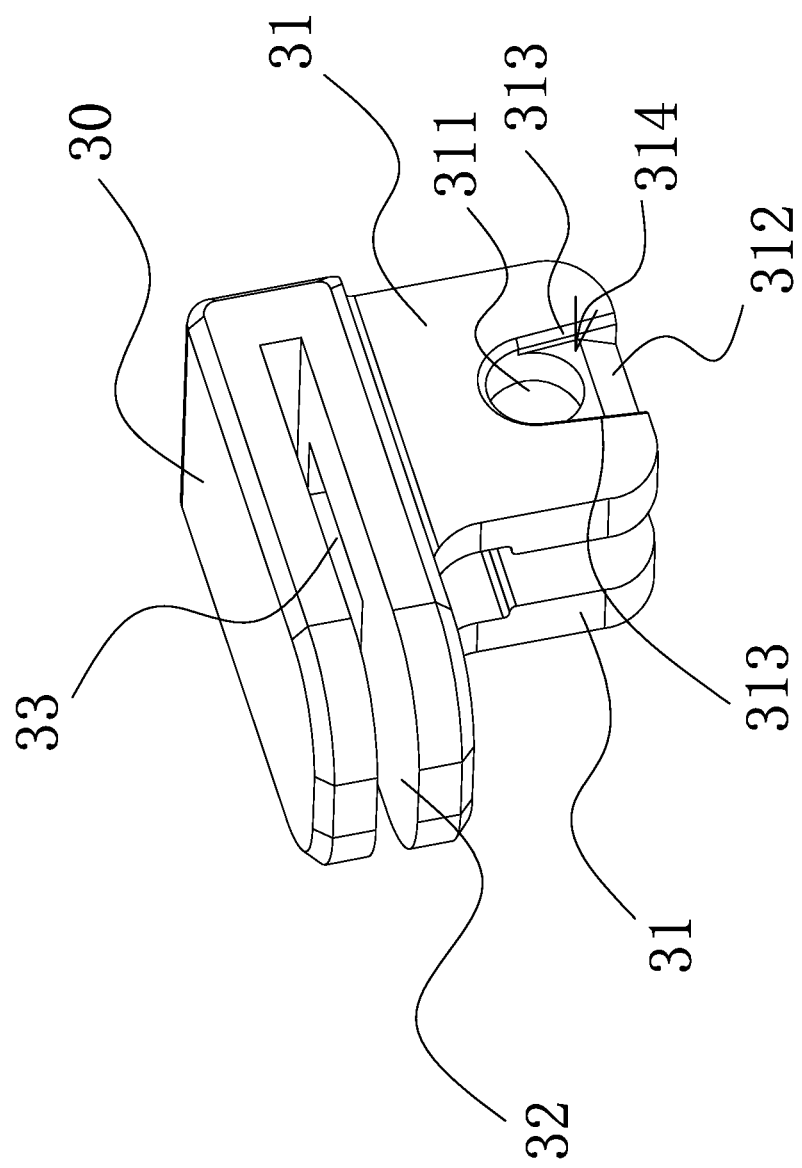
FIG. 5 is a structural diagram of a connector in the preferred embodiment of the present invention.

As shown in FIG. 1 and FIG. 2, the cover plate 20 can be assembled on and connected to the main frame body 10, or has one side opened and the other side connected to the main frame body 10 in an articulated manner, so that operation is more convenient and reliable.

As shown in FIG. 1 to FIG. 5, the present invention further protects a cable management frame comprising:

A main frame body 10 formed with cable management grooves 11 for managing cables; and A cover plate 20 detachably connected to the main frame body 10 through a plurality of pairs of connectors 30, wherein two connectors 30 of the same pair are vertically assembled on the cover plate 20; and a whole structure composed of the cover plate 20 and the connectors 30 can be directly disassembled from the main frame 10, or one side of the whole structure composed of the cover plate and the connectors is separated from the main frame body, and the other side is articulated with the main frame body, and in this case, the corresponding connectors 30 are connected to the main frame body 10 in an articulated manner.

The cable management frame is reasonable and ingenious in overall structure. The connectors 30 and the cover plate 20 which are independent of each other (not integrally formed) are assembled together; the connectors 30 in close fit with the cover plate 20 are improved to realize movable connection of the cover plate 20 and the main frame body 10; the cable management grooves 11 in the main frame body 10 are used to manage and store the cables; and the cover plate 20 is closely connected to the main frame body 10 at the corresponding upper position and lower position through the connectors 30 distributed vertically. When the cable management frame is closed, the connectors 30 are correspondingly connected to the main frame body 10, and a main portion of the whole cable management frame is defined by the cover plate 20 and the main frame body 10; and when the cable management frame needs to be opened, the cover plate 20 together with the connectors 30 assembled on the cover plate 20 can be entirely disassembled from the main frame body 10, and in this case, all the connectors 30 are separated from the main frame body 10. Furthermore, it should be noted that the cover plate 20 has one side opened and the other side connected to the main frame body 10 in an articulated manner, and in this case, the connectors 30 on the corresponding side of the cover plate 20 are connected to the main frame body 10 in an articulated manner. In this way, the problem of placement of an existing cover plate 20 completely disassembled from the main frame body 10 is solved, and open sides of the cover plate 20 can be easily switched (for example, the cover plate 20 has an upper side opened and a lower side connected to the main frame body 10, or has the lower side opened and the upper side connected to the main frame body 10), so that operation and maintenance are greatly facilitated. Particularly, the cables can be managed and maintained more conveniently when wound around the main frame body 10 having upper and lower portions formed with the cable management grooves 11.

Further, in the present invention, two pairs of connectors 30 distributed on the left and right are fixedly assembled on the cover plate 20 and are respectively close to the left end and the right end of the cover plate 20, so that the cover plate 20 is connected to the main frame body 10 and is opened and closed more stably and reliably, and the overall stability of the assembled cable management frame is guaranteed.

In brief, the two pairs of connectors 30 on the cover plate 20 are respectively close to the left end and the right end of the cover plate 20, each pair of connectors 30 includes two connectors 30 distributed vertically, and two upper connectors 30 are fixedly assembled on the upper portion of the cover plate 20, and two lower connectors 30 are fixedly assembled on the lower portion of the cover plate 20. Furthermore, the connectors 30 and the cover plate 20 are fixedly assembled together, so that the cover plate 20 is connected to the main frame body 10 more reliably, and assembly and subsequent assembly during transportation are facilitated.

In a preferred or optional embodiment, the main frame body 10 is made from metal, the cover plate 20 is preferably made from metal, and the connectors 30 are made from plastics. The connecting through holes 311 are formed in each connector 30; the plurality of pairs of connecting protrusions 12 matched with the connecting through holes 311 are arranged on the main frame body 10; the gap exists between the connecting protrusions 12 of the same pair; and the corresponding connector 30 is inserted into the gap, and in this case, the connecting protrusions 12 are clamped in the corresponding connecting through holes 311.

To decrease scratches and prolong the service life of parts, preferably, the connecting protrusions 12 are in smooth or circular contact with the corresponding connector 30, so that resistance is reduced, and abrasion is avoided.

Such combination of the plastic connectors 30, the metal cover plate 20, and the metal main frame body 10 means a connection between plastic fasteners and a metal frame, so that a flexible movement space at a connection position, as well as structural strength of the whole cable management frame, support stability and reliability, and connection stability and reliability is guaranteed.

Similarly, to further fulfill the flexible movement space formed when the connectors 30 are clamped with the main frame body 10, two connecting blocks 31 in one-to-one correspondence with the two connecting protrusions 12 of the same pair are oppositely arranged on each connector 30; a gap exists between the two connecting blocks 31; the connecting through holes 311 are respectively formed in the connecting blocks 31; and when the connectors 30 are clamped with the main frame body 10, the connecting blocks 31 are clamped in the gap between the corresponding connecting protrusions 12, and the connecting protrusions 12 are correspondingly clamped, along the external walls of the connecting blocks 31, into the connecting through holes 311 in the connecting blocks 31. When disassembly is required, the cover plate 20 together with the connectors 30 is outwards pulled to disengage from the main frame body 10. If one end of the cover plate 20 is opened, the connector 30 on the other end of the cover plate 20 is connected to the main frame body 10 in an articulated manner, and in this case, the cover plate 20 can rotate around an articulated point, that is, the connecting protrusions 12 are connected into the corresponding connecting through holes 311 in an articulated manner.

Of course, the rigid main frame body 10 with gaps also has certain flexible spaces. However, the flexible movement space formed by means of the cooperation between each plastic connector 30 and the rigid main frame body 10 can be partially compressed and then restored, thus achieving a better effect, facilitating the repeated entry and exit of the connectors 30, and guaranteeing the strength of the whole structure formed after the plastic connectors 30 are connected to the rigid main frame body 10.

In a preferred embodiment, each connecting block 31 is provided with a guide slope 312 located on a clamping path of the corresponding connecting protrusion 12 as well as two guide side faces 313 respectively located on two sides of the guide slope 312.

In a further preferred embodiment, the two guide side faces 313 connected to the same connecting through hole 311 are arranged oppositely, and the two guide side faces define a guide channel 314 gradually narrowed towards the connecting through hole 311 and connected to the connecting through hole 311, and the corresponding guide slope 312 is located on the lower portion of the guide channel 314. By means of such guide structure, the connecting block 31 can be connected to the corresponding connecting protrusions 12 more closely and can enter and exit from the gap between the connecting protrusions 12 more smoothly.

Preferably, to make sure that the connectors 30 are fixedly assembled and limited on the cover plate 20 reliably, an assembly groove 32 has an internal wall formed with a limit groove 33 is formed in each connector 30; a limit protrusion 21 tilted outwards and matched with the limit groove 33 is arranged on at assembly position of the connector 30, on the cover plate 20; and the limit groove 33 is preferably located between the corresponding two connecting blocks 31, so that the use rate of space is further improved, and the limit protrusion 21 clamped in the limit groove 33 is unexposed and is convenient to machine.

During assembly, the edge of the cover plate 20 is correspondingly inserted into the assembly grooves 32, and the limit protrusions 21 are clamped in the limit grooves 33, so that the connectors 30 are fixedly and firmly assembled on the cover plate 20. Normally, the connectors 30 will not fall from the cover plate 20.

With regard to a cable management frame on the present market, mainly due to the fact that cable management grooves 11 are improperly designed in structure and a large number of cables are prone to getting close to a cover plate 20 and even exceeding a main frame body 10, the cables are likely to be deformed due to squeeze when the cover plate 20 is buckled on the main frame body 10.

In view of this, further preferably, the cable management grooves 11 are formed in both the upper portion and lower portion of the main frame body 10; the number of the cable management grooves 11 corresponds to the number of pairs of the connecting protrusions 12; each cable management groove 11 is connected to the edge of the main frame body 10 via a cable management channel 13; after the cover plate 20 is connected to the main frame body 10, an entrance of the cable management channel 13 is closed; and wire hanging structures 14 extending to the center of the cable management groove are arranged at the joint between the cable management groove 11 and the cable management channel 13.

Each cable management groove 11 is connected to the edge of the main frame body 10 via the corresponding cable management channel 13, an entrance of each cable management groove 11 is formed at the joint between the cable management channel 13 and the cable management groove 11, and the corresponding wire hanging structures 14 for inwards winding of cables are arranged at an entrance position.

In the present invention, the wire hanging structures 14 are designed ingeniously and overcome the structural defects of cable management grooves 11 on the present market that almost all cables are managed and stored in the cable management grooves 11, and almost no cables are wound in cable management channels 13, let alone a connection position of a cover plate 20. Accordingly, the cables are prevented against damage caused by squeeze, and the overall cable management effect is guaranteed.

Further, to improve the cable management effect and prevent the cables from entering the cable management channels 13 and from affecting the connection of the cover plate 20 (connectors 30), the cable management channels 13 are narrower than the cable management grooves 11, that is, the maximum width of the cable management channels 13 is less than the minimum width of the cable management grooves 11; and the wire hanging structures 14 are located on corner where internal walls of the corresponding cable management groove 11 and internal walls of the corresponding cable management channel 13 are connected, so that the inwards winding effect of the cables is guaranteed, and the structural layout is proper and ingenious.

Preferably, to further properly increase the volume of the cable management grooves 11 to make sure that the cables are all stored and managed in the cable management grooves 11, an overall width of the cable management grooves 11 is gradually reduced, and wider ends of the cable management grooves 11 are connected to the corresponding cable management channels 13.

The specific embodiments described herein are only used for illustratively explaining the spirit of the invention. Various modifications, supplements, or similar substitutions of these specific embodiments can be made by those skilled in the art without deviating from the spirit of the invention and the scope defined by the appended claims of the invention.

What is claimed is:

1. A connecting fastener structure, comprising:
   a main frame body; and
   a cover plate on which a connector is assembled, wherein the cover plate is detachably connected to the main frame body through the connector; connecting through holes are formed in the connector; at least one pair of connecting protrusions matched with the connecting through holes are arranged on the main frame body; a gap exists between two connecting protrusions of a same pair and allows the connector to be inserted therein, and in this case, the two connecting protrusions of a same pair are clamped in the connecting through holes; and a whole structure composed of the cover plate and the connector can be directly disassembled from the main frame body, or be connected to the main frame body in an articulated manner, and in this case, the connector is connected to the main frame body in an articulated manner;
   wherein two connecting blocks in one-to-one correspondence with the two connecting protrusions of a same pair are oppositely arranged on the connector, a gap exists between the two connecting blocks, and the connecting through holes are respectively formed in each of the two connecting blocks.

2. The connecting fastener structure according to claim 1, wherein the main frame body is made from metal, and the connector is made from plastics.

3. The connecting fastener structure according to claim 1, wherein each of the two connecting blocks is provided with a guide slope located on a clamping path of the corresponding connecting protrusion as well as two guide side faces respectively located on two sides of the guide slope.

4. The connecting fastener structure according to claim 3, wherein the two guide side faces connected to the same connection through hole are arranged oppositely, and the two guide side faces define a guide channel gradually narrowed towards the connecting through hole and connected to the connecting through hole.

5. The connecting fastener structure according to claim 1, wherein an assembly groove has an internal wall formed with a limit groove is formed in the connector, and a limit bulge tilted outwards and matched with the limit groove is arranged at the assembly position of the connector, on the cover plate.

6. A cable management frame, comprising the connecting fastener structure according to claim 1.

7. A cable management frame, comprising:
   a main frame body formed with cable management grooves; and
   a cover plate detachably connected to the main frame body through a plurality of pairs of connectors, wherein two connectors of a same pair are vertically assembled on the cover plate; and a whole structure composed of the cover plate and the connectors can be directly disassembled from the main frame body, or one side of the whole structure composed of the cover plate and the connectors is separated from the main frame body, and the other side is articulated with the main frame body, and in this case, the corresponding connectors are connected to the main frame body in an articulated manner;
   wherein connecting through holes are formed in each said connector; a plurality of pairs of connecting protrusions matched with the connecting through holes are arranged on the main frame body; a gap exists between the two connecting protrusions of a same pair; and the corresponding connector is inserted into the gap, and in this case, the two connecting protrusions of a same pair are clamped in the corresponding connecting through holes; and
   wherein two connecting blocks in one-to-one correspondence with the two connecting protrusions of a same pair are oppositely arranged on the connector, a gap exists between the two connecting blocks, and the connecting through holes are respectively formed in each of the two connecting blocks.

8. The cable management frame according to claim 7, wherein two pairs of connectors distributed on the left and right are fixedly assembled on the cover plate.

9. The cable management frame according to claim 7, wherein an assembly groove has an internal wall formed with a limit groove is formed in the connector, and a limit bulge tilted outwards and matched with the limit groove is arranged at the assembly position of the connector, on the cover plate.

10. The cable management frame according to claim 7, wherein the cable management grooves are formed in both an upper portion and a lower portion of the main frame body; the number of the cable management grooves corresponds to the number of pairs of the connecting protrusions; each said cable management groove is connected to an edge of the main frame body via a cable management channel; after the cover plate is connected to the main frame body, an entrance of the cable management channel is closed; and wire hanging structures extending to a center of the cable management groove are arranged at a joint between the cable management groove and the cable management channel.

11. The cable management frame according to claim 10, wherein the cable management channels are narrower than the cable management grooves, and the wire hanging structures are located on corner where internal walls of the corresponding cable management groove and internal walls of the corresponding cable management channel are connected.

12. The cable management frame according to claim 10, wherein an overall width of the cable management grooves is gradually reduced, and wider ends of the cable management grooves are connected to the corresponding cable management channels.

\* \* \* \* \*